United States Patent [19]

Lee et al.

[11] Patent Number: 4,584,079
[45] Date of Patent: Apr. 22, 1986

[54] STEP SHAPE TAILORING BY PHASE ANGLE VARIATION RF BIAS SPUTTERING

[75] Inventors: Eddie C. Lee, Bloomington; William H. Nunne, New Hope, both of Minn.

[73] Assignee: Honeywell Inc., Minneapolis, Minn.

[21] Appl. No.: 540,246

[22] Filed: Oct. 11, 1983

[51] Int. Cl.⁴ .............................................. C23C 15/00
[52] U.S. Cl. ........................... 204/192 S; 204/192 R; 204/192 D; 357/23.1; 357/24; 357/52; 357/54; 357/65; 357/68
[58] Field of Search ............ 204/192 R, 192 D, 192 S

[56] References Cited

U.S. PATENT DOCUMENTS

| Re. 28,952 | 8/1976 | Dingwall | 357/65 |
|---|---|---|---|
| 3,868,723 | 2/1975 | Lechaton et al. | 357/54 |
| 4,131,533 | 12/1978 | Bialko et al. | 204/298 |
| 4,284,489 | 8/1981 | Weber | 204/298 |
| 4,428,810 | 1/1984 | Webb et al. | 204/192 R |

OTHER PUBLICATIONS

J. S. Logan, "Control of RF Sputtered Film Properties Through Substrate Tuning", Mar., 1970, IBM J. Res. Develop., 172–175.
R. E. Jones, C. L. Standley, L. I. Maissel, "Re-Emission Coefficients of Si and SiO₂ Films Deposited Through rf and dc Sputtering", Nov., 1967, J. Applied Physics, vol. 38, No. 12, 4656–4662.
Arshad Mumtaz, "RF Magnetron Sputtered Silicon Dioxide with RF Bias", Materials Research Corporation, JVST, pp. ST-V-1-ST-V-15, (1982).
C. Y. Ting, V. J. Vivalda, H. G. Schaefer, "Study of Planarized Sputter-Deposited SiO₂", J. Vac. Sci. Technol., 15(3), May/Jun., 1978, 1105–1112.

*Primary Examiner*—Arthur P. Demers
*Attorney, Agent, or Firm*—John P. Sumner

[57] ABSTRACT

Disclosed is a method for tailoring the shape of a dielectric layer covering a step in a semiconductor device. The method comprises placing a semiconductor device comprising the step into a low pressure ionization chamber comprising a target electrode and a substrate electrode; connecting a sample of the dielectric to the target electrode; placing the semiconductor device comprising the step onto the substrate electrode; powering the target electrode and the substrate electrode with a radio frequency power having an electrical phase angle between the substrate electrode and the target electrode; and adjusting the electrical phase angle to obtain the desired shape of the dielectric layer covering the step.

2 Claims, 6 Drawing Figures

STEP SHAPE TAILORING BY PHASE ANGLE VARIATION RF BIAS SPUTTERING

BACKGROUND OF THE INVENTION

The present invention relates to the formation of dielectric layers used in integrated semiconductor circuits. More particularly, the present invention relates to tailoring the shape of a dielectric layer covering a step such as a metal step associated with metalization patterns within integrated semiconductor circuits.

As is more completely explained below prior art processes of depositing dielectric or insulative layers in semiconductor devices initially were accomplished by an RF (radio frequency) sputtering process not involving a bias between the anode and cathode of the sputtering device. Such a process resulted in good conformal step coverage in that the coating thickness covering the sidewall of the metal step was nearly equal to the film thickness covering lateral surfaces.

A disadvantage of this prior art process was cusping or the building up of material at the corner of layers. Further, in Very Large Scale Integration (VLSI) technology, individual metalized circuits are spaced very closely together. If these individual metalizations are covered with conformal dielectric layers covering the sidewall of the metalization with a thickness substantially equal to the film thickness, particularly with cusping at the corners, a topography having a very high aspect ratio of height to width can be created between the conformal coatings of adjacent metalizations. Such a topography is a difficult to fill and often results in void formation during the formation of layers. This void formation will result in device failures due to gas expansion in the voids during subsequent processing steps.

With the improvement of adding a bias between the cathode and the anode in RF sputtering, the process being called RF bias sputtering, cusping was lessened, and dielectric coverage of metalization steps became less conformal. In RF bias sputtering, the bias between the cathode and the anode causes resputtering at the substrate or semiconductor device since the bias accelerates ions into the corners (of what would be conformal coatings) to taper the corners. This helps reduce cusping and the very high aspect ratios between the dielectric elevations above adjacent metalization patterns since the dielectric elevations have sloping edges which are more easily planarized in subsequent or concurrent processing.

A disadvantage, however, of RF bias sputtering as it exists in the prior art is that the tapered corners caused by the ion bombardment tend to have sharp edges at the corners, and these sharp edges are exaggerated as cusps in subsequent layers of metalization and dielectric. This undesirable cusping, while less serious than with unbiased RF sputtering, still presents a significant problem in multilayer devices since each subsequent layer tends to exaggerate the cusp in the previous layer, thus resulting in less planarization than is desired.

Through the present invention, the shape of a dielectric layer covering a step in a semiconductor device can be tailored to round sharp edges or corners, to substantially eliminate cusping, and/or to otherwise improve planarization. Such tailored shapes to dielectric layers were previously unknown.

SUMMARY OF THE INVENTION

The present invention is a method for tailoring the shape of a dielectric layer covering a step in a semiconductor device. The method comprises placing a semiconductor device comprising the step into a low pressure ionization chamber comprising a target electrode and a substrate electrode; connecting a sample of the dielectric to the target electrode; placing the semiconductor device comprising the step onto the substrate electrode; powering the target electrode and the substrate electrode with a radio frequency power having an electrical phase angle between the substrate electrode and the target electrode; and adjusting the electrical phase angle to obtain the desired shape of the dielectric layer covering the step.

DESCRIPTION OF THE PREFERRED EMBODIMENT

In the construction of thin film integrated semiconductor circuits wherein a passivating or insulating film or layer is sputter-deposited over a raised conductive line pattern, e.g., a metalization pattern, on a substrate, the insulative film generally follows the contours of the underlying metalization pattern, i.e., the insulative layer will have raised portions or elevations corresponding to the pattern. Finding ways to remove these elevations so that multilayer devices are as planar as possible has long been of interest.

Sometimes large dielectric layer thicknesses for complete planarization are undesireable because of long processing times and the difficulty in metalizing subsequent via holes made in the relatively thick layers. For this and other reasons, complete planarization is not always obtained.

Figure 1:
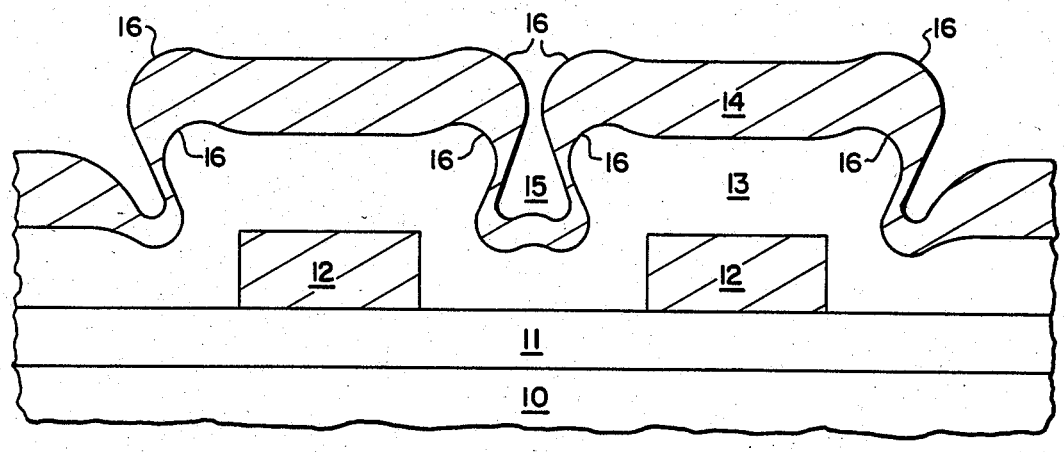
FIG. 1 illustrates a semiconductor device comprising a dielectric layer formed using prior art RF sputtering.

As previously mentioned, RF sputtering of dielectric layers over metal lines was first accomplished without bias. When no biasing is used in RF sputtering to apply dielectric, no resputtering occurs; i.e., there is only deposition occurring. FIG. 1 illustrates a device in which a dielectric layer 13 was formed with unbiased RF sputtering.

Describing FIG. 1 more completely, a semiconductor body 10 such as silicon is illustrated. Body 10 has formed thereon an insulative material 11 which may be silicon dioxide formed by a thermal oxidation of the surface of substrate 10 or a material deposited by chemical vapor deposition or sputtering. Such materials include silicon dioxide, silicon nitrate or aluminum oxide. Layer 11 acts to passivate or protect silicon substrate 10 as well as to insulate substrate 10 from a metalization interconnection pattern of which lines 12 are a portion. The metalization pattern is formed on layer 11 by conventional integrated circuit fabrication techniques; e.g., by DC (direct current) sputter deposition and plasma etching. The metalization pattern is selectively connected to devices at the surface of substrate 10 by connectors, not shown, selectively passing through insulative layer 11 to the substrate. The metalization pattern formed of lines 12 is covered by an overlayer 13 of insulative material, such as silicon dioxide, which protects and insulates the metalization pattern. Since it is necessary to selectively access lines 12 in the metalization pattern from above at selected sites in order to provide contacts for "off-chip" connections or to connect lines 12 with a second level metalization pattern 14 deposited on insulative layer 13, via holes, not shown, must also be made through insulative layer 13 to lines 12. As further discussed below, because RF sputtering techniques provide layer 13 of substantially uniform thickness, layer 13 will contain elevations corresponding to underlying metalization lines 12. Metalization pattern 12 may be any conventional metal used in integrated circuits, such as aluminum, aluminum-copper alloys, platimum, palladium, chromium, or molybdenum.

As has previously been mentioned, if the device of FIG. 1 is fabricated with RF sputtering processes not involving a bias between the cathode and anode, no resputtering will occur, and dielectric layer 13 sputtered above layer 11 and metal lines 12 will have a conformal configuration; i.e., coverage of the sidewalls of metalization lines 12 substantially equal to the film thickness. In addition, dielectric layer 13 will have cusps 16 because of the sharp corners caused by dry etching of lines 12. Subsequently, when second metalization layer 14 is applied above dielectric layer 13, the elevations and cusps previously defined by layer 13 above metal lines 12 are even further exaggerated.

Further, it is now desired to place metal lines 12 more closely together than has been done in less dense integrated circuits in the past. This close spacing of metal lines 12 can result in a problem illustrated in FIG. 1, namely, that the elevations above metal lines 12 can result in a space 15 between the elevations having a very high aspect ratio of height to width. Since the shapes of dielectric layer 13 and metal layer 14 are highly conformal to the underlying geometry of the device; i.e., to the metalization lines 12 (due, in this case, to the fact that RF sputtering without biasing was used to form dielectric 13) and since the corners of these layers include cusps 16, space 15 with its high aspect ratio of height to width is very difficult to fill in subsequent layering of additional layers of dielectric and metalization. If space 15 is not filled, device failure during subsequent processing steps will occur due, at least in part, to the expansion of gases within space 15. In addition, space 15 causes other problems including blistering and cracking between metal layers and low dielectric breakdowns, ultimately leading to loss of signal between integrated circuit devices.

Figure 2:
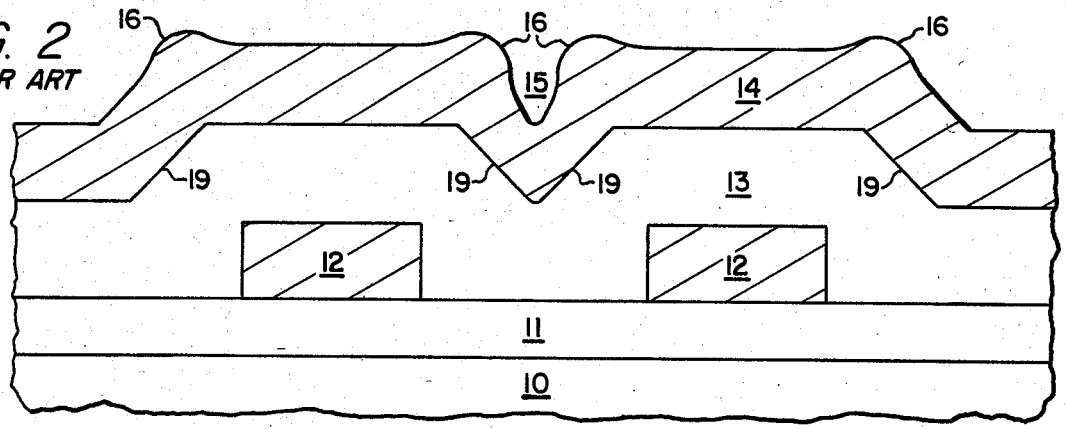
FIGS. 2 and 4 illustrates a semiconductor device comprising a dielectric layer formed using prior art RF biased sputtering.

With the introduction of RF bias sputtering, some improvements were made which permitted easier planarization. With bias introduced to RF sputtering, resputtering or removal of the material being deposited occurs through the process of ions bombarding the deposited surface, the ions being accelerated by the bias. These ions attack corners and tend, for example, to change right angle corners into slopes 19. This is illustrated in FIG. 2 where it can be seen that while 100% step coverage is still maintained, dielectric layer 13 is less conformal than it is in FIG. 1. The coverage of the sidewalls in FIG. 2 is less conformal in that dielectric layer 13 covering metal lines 12 comprises slopes 19 above the corners of layer 12. These slopes 19 are of some advantage. As can be seen, space 15 is substantially reduced in its height to width aspect ratio. Therefore, in some respects planarization is more easily obtained with prior art RF bias sputtering than with prior art unbiased sputtering. Nevertheless, limitations still exist with prior art RF bias sputtering. As can be seen in FIG. 2, the sharp edges caused by the intersection of slopes 19 with lateral surfaces tends to cause cusps 16 in the next metal layer. If as with the present invention these slopes and edges can be tailored, planarization and cusp elimination is even further enhanced.

Figure 4:
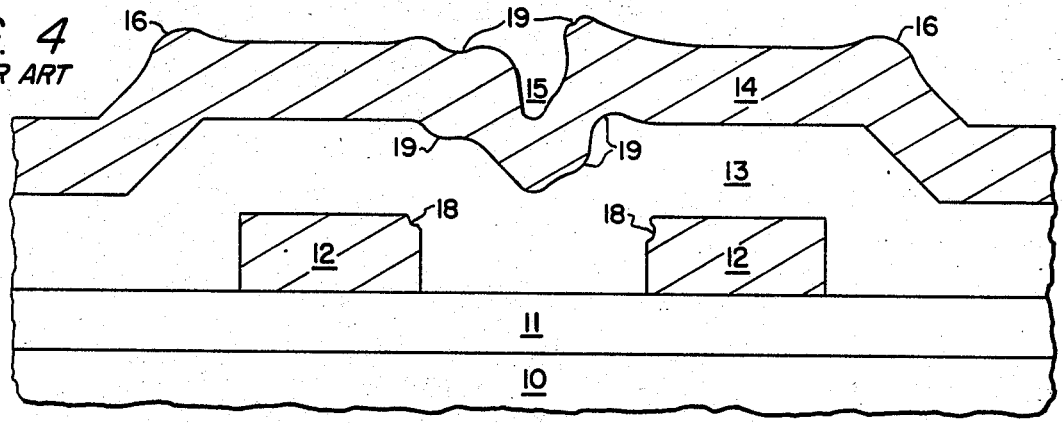

Before proceeding to discuss the present invention another disadvantage of the prior art will be discussed. It is not unusual for metal steps 12 to have imperfections 18 at their corners due to dry etching. As illustrated in FIG. 4, any imperfections such as those shown at 18 tend to be exaggerated in each subsequent layer if prior art RF bias sputtering is used. The best solution in the prior art was to completely planarize or level the entire structure by very long and difficult RF bias sputtering sequences taking, for example, 24 hours to accomplish. With the present invention, however, the shape of a dielectric layer covering a metal step, including, for example, an imperfection, may be tailored to eliminate or to help eliminate cusps 16 and subsequent exaggeration of imperfections 18. Further, tailoring through the present invention may be accomplished in a relatively simple and much shorter RF bias deposition cycle than in the planarization sequences of the prior art.

Figure 6:
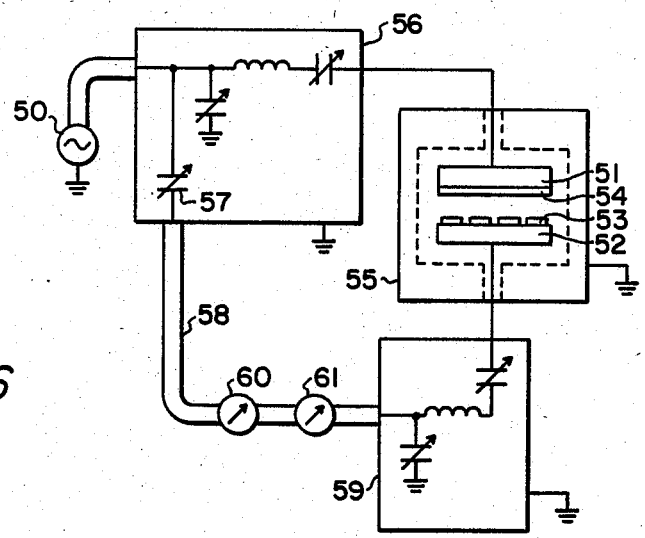
FIG. 6 illustrates apparatus compatible with the present invention.

Virtually any prior art apparatus for RF bias sputtering may be used to practice the present invention provided that the electrical phase between the cathode and wafer holder can be altered. FIG. 6 illustrates one such apparatus. RF generator 50 supplies power to target electrode 51 supporting a target 54 of the silicon dioxide material or other dielectric to be deposited on the semiconductor devices or integrated circuit wafers 53 which are shown supported on electrodes 52. The electrodes are contained in a conventional vacuum chamber 55. Upper matching network 56 includes a coupling capacitor 57 which may have a magnitude from 50 to 250 pF which permits continuous adjustment of the power splitting operation. Wafer holder/electrode 52 is driven by a matched 50 ohm transmission cable 58. The lower matching network 59 transforms the input impedance of electrode 52 to a 50 ohm load so that cable 58 functions as a delay line. The electrical phase between electrode 51 and electrode 52 may be adjusted in accordance with the present invention by selecting the appropriate length for cable 58 or by electrically retarding one phase of the power supply (more than one power supply appropriately phased and/or employing delay cables may also be used). Because cable 58 is matched, the effect of resputtering is easily monitored by forward and reflected power meters 60 and 61 as well as by controlling the DC bias on substrate electrode 52.

Apparatus 55 may be operated at a total power of 4.0 KW, an electrode 51 power of 2.7 KW, an electrode 52 power of 1.3 KW, and a chamber argon pressure of 12 microns.

In the apparatus shown in FIG. 6, the phase angle is typically adjusted by adjusting the length of cable 58. Using such an approach phase angle can be roughly calculated using the following equation:

$$C = \lambda \nu$$

Where:

C=speed of light; $3\times10^8$ m/sec $\nu$=RF frequency used during deposition=13.56 MHz $\lambda$=length of straight cable required for 1 complete cycle (360 degrees out of phase)

For example, for 45 degrees out of phase, 9.07 feet of straight cable will be necessary.

Figure 3:
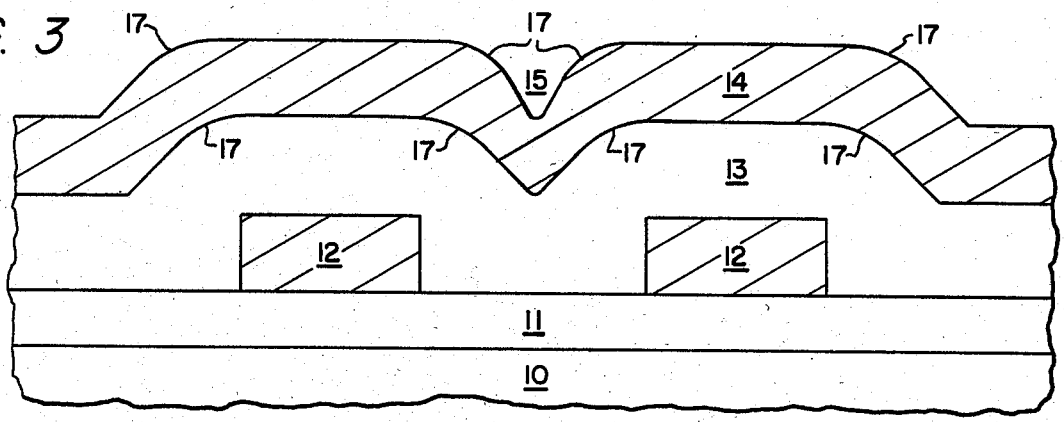
FIGS. 3 and 5 illustrate a semiconductor device comprising a dielectric layer tailored in accordance with the present invention.
Figure 5:
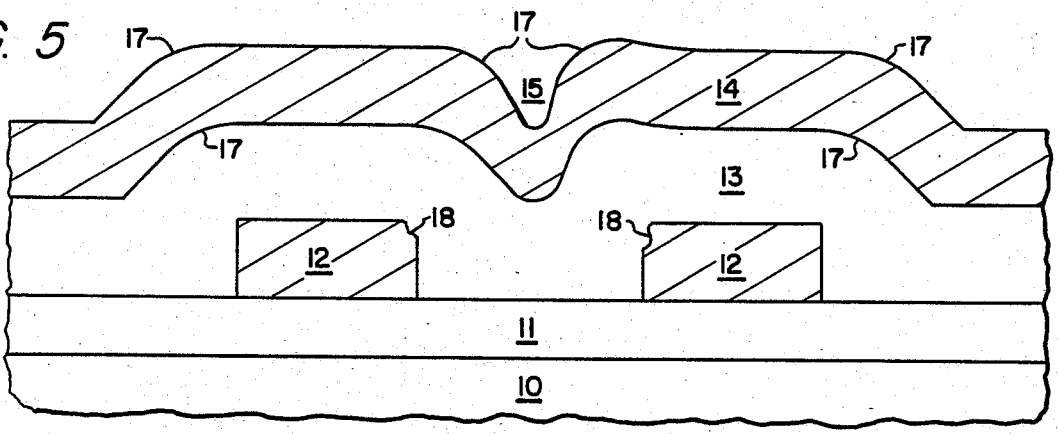

The present invention is a simple one. It simply consists of adjusting the phase angle between the power on RF bias sputtering electrodes such as 51 and 52 to obtain the desired shape of dielectric layers such as 13 over steps such as 12. The optimum phase angle shift varies significantly according to the type of equipment used, and more importantly, to the type, size, and geometry of the semiconductor device built. However, once a phase angle is found for particular equipment and devices, tailored layers such as illustrated in FIGS. 3 and 5 can be readily accomplished to round sharp edges or corners, to substantially eliminate cusping, and/or to otherwise improve planarization. Not only are superior devices available through the present invention, but the devices are available with high yields, with 100% step coverage, and without the long, tedious planarization processes of the prior art.

The embodiments of the invention in which an exclusive property or right is claimed are defined as follows:

1. A method for tailoring the shape of a dielectric layer covering a step in a semiconductor device, comprising:

placing the semiconductor device comprising the step into a low pressure ionization chamber comprising a target electrode and a substrate electrode;

connecting a sample of the dielectric to the target electrode;

placing the semiconductor device comprising the step onto the substrate electrode;

powering the target electrode and the substrate electrode with radio frequency power having a phase angle between the substrate electrode and the target electrode; and adjusting the phase angle to obtain the desired nonplanar shape of the dielectric layer covering the step.

2. A method for tailoring the shape of a dielectric layer covering a step in a semiconductor device, comprising:

placing the semiconductor device comprising the step into a low pressure ionization chamber comprising a target electrode, and a substrate electrode the target electrode comprising a sample of the dielectric, the semiconductor device comprising the step being placed onto the substrate electrode;

powering the target electrode and the substrate electrode with radio frequency power having a phase angle between the substrate electrode and the target electrode; and adjusting the phase angle to obtain the desired shape of the dielectric layer covering the step.

* * * * *